United States Patent
Tripathi et al.

(10) Patent No.: US 10,061,775 B1
(45) Date of Patent: Aug. 28, 2018

(54) SCALABLE AND PERSISTENT L2 ADAPTIVE REPLACEMENT CACHE

(71) Applicant: HGST, Inc., San Jose, CA (US)

(72) Inventors: Shailendra Tripathi, Fremont, CA (US); Daniel McGregor, Union City, CA (US); Enyew Tan, Newark, CA (US)

(73) Assignee: HGST, Inc., San Jose, CA (US)

( * ) Notice: Subject to any disclaimer, the term of this patent is extended or adjusted under 35 U.S.C. 154(b) by 0 days.

(21) Appl. No.: 15/626,101

(22) Filed: Jun. 17, 2017

(51) Int. Cl.
| | |
|---|---|
| *G06F 12/00* | (2006.01) |
| *G06F 17/30* | (2006.01) |
| *H03M 7/30* | (2006.01) |
| *G06F 12/127* | (2016.01) |
| *G06F 12/123* | (2016.01) |
| *G06F 12/122* | (2016.01) |

(52) U.S. Cl.
CPC ...... *G06F 17/30067* (2013.01); *G06F 12/122* (2013.01); *G06F 12/123* (2013.01); *G06F 12/127* (2013.01); *G06F 17/30017* (2013.01); *G06F 17/3061* (2013.01); *G06F 17/3074* (2013.01); *G06F 17/30244* (2013.01); *G06F 17/30781* (2013.01); *H03M 7/30* (2013.01); *G06F 2212/502* (2013.01)

(58) Field of Classification Search
CPC ............. G06F 17/30067; G06F 12/122; G06F 12/123; G06F 12/127
See application file for complete search history.

(56) References Cited

U.S. PATENT DOCUMENTS

| | | | |
|---|---|---|---|
| 6,996,676 B2 | 2/2006 | Megiddo et al. | |
| 7,496,586 B1* | 2/2009 | Bonwick | ........... G06F 17/30067 |
| 2002/0169936 A1* | 11/2002 | Murphy | .............. G06F 12/1009 |
| | | | 711/205 |
| 2007/0106846 A1 | 5/2007 | Bonwick et al. | |

OTHER PUBLICATIONS

Megiddo et al., One up on LRU, Aug. 2003 (Year: 2003).*

* cited by examiner

*Primary Examiner* — Gurtej Bansal

(57) ABSTRACT

A method, system and a computer program product for managing file system memory includes a module configured to implement a separate replacement policy and a separate index for a persistent second level adaptive replacement cache (L2ARC) logically part of a first level ARC. The system also includes a module configured to cluster compressed chunks of data on multiple physical devices via aligning the clusters of data chunks on a byte boundary basis on each of the devices. The method additionally includes a module configured to create a storage pool allocator (SPA) to track the compressed and packed chunks on the multiple devices via an attached active page and attached multiple closed pages. The method further includes re-adding an evicted data from the L2ARC to an active page to be written again thereto based on a configurable threshold number of hits to data in the L2ARC via an L2ARC hit counter.

18 Claims, 7 Drawing Sheets

SCALABLE AND PERSISTENT L2 ADAPTIVE REPLACEMENT CACHE

BACKGROUND OF THE INVENTION

The ZetaByte File System (ZFS) uses a logging mechanism, the ZFS intent log (ZIL) to store synchronous writes, until they're safely written to the main data structure in the memory storage pool. The speed at which data can be written to the ZIL determines the speed at which synchronous write requests can be serviced: the faster the ZIL, the faster most databases, NFS and other important write operations become. Normally, the ZIL is part of the regular memory pool on storage disk. But ZFS offers the possibility to use a dedicated device for the ZIL. This is then called a "log device".

ZFS also has a sophisticated cache called the "Adaptive Replacement Cache" (ARC) where it stores both most frequently used blocks of data and most recently used ones. The ARC is stored in RAM, so each block of data that is found in the RAM can be delivered quickly to the application, instead of having to fetch it again from disk. When RAM is full, data needs to be thrown out of the cache and is not available any more to accelerate reads.

Solid-state arrays (SSA) have moved the external controller-based storage array market from a relatively stagnant incrementally improving market with slow-changing dynamics to a progressive neoclassical market. Improvements in the dynamics of many factors—such as reduced storage administration, power, cooling, rack space, increased performance and density—have changed the accepted assumptions of the previous SAN storage array market. Many vendors design and develop their own custom solid-state solutions. Consequently, more vendors are offering alternate solid-state media form factors with denser and faster systems when they create their own NAND flash storage packaging. From a whole system perspective, the largest SSAs now scale to 3.9 PB, and next-generation SSD technology and interconnects will again redefine performance capabilities, creating demand for faster storage networks.

Neither the solid-state array, nor the storage array administrator is the bottleneck anymore; but network latency has become the challenge. This has extended the requirement and life span for 16 Gbps and 32 Gbps Fibre Channel SANs, as Ethernet-based networks and related storage protocols struggle to keep up. Many new vendors have entered the market who provide comprehensive service management, and along with many traditional storage vendors, they continue to transition their portfolios from HDD-based arrays to all solid-state arrays.

Therefore, an SSA that is two to three times more expensive to purchase becomes a cost-effective replacement for a hybrid or general-purpose array at increased utilization rates. With regard to performance, one SSD can typically replace multiple HDDs, combined with data reduction features and increased storage administrator productivity the price point at which SSA investment decisions are made is dropping rapidly. Redundant array of independent disks (RAID) rebuild times for high-capacity SSDs are also faster than for high-capacity HDDs. Therefore, as HDD storage capacities increase, so do HDD recovery times, and SSAs reduce the risk exposure during any media failure and recovery window. Use cases for SSAs are moving into analytics, file and object workloads, and some customers even use SSAs as backup targets to reduce backup and restore windows.

Price and ownership programs translate into very competitive purchase prices for buyers, but vendors are faced with challenges to becoming profitable as incumbent vendors discount to avoid losing market share and new vendors discount to attract new customers. Because the SSA market has expanded rapidly with SSD reliability being equal to or better than HDD arrays, and feature parity also equalizing, the competitive battle to differentiate has moved to ease of ownership, and remote and pre-emptive support capabilities.

In contrast to block and file I/O storage systems, when an object is stored in Object addressable data storage systems (OAS), the object is given a name that uniquely identifies it and that also specifies its storage location. This type of data access therefore may eliminate the need for a table index in a metadata store and it may not be necessary to track the location of data in the metadata. An OAS receives and processes access requests via an object identifier that identifies a data unit or other content unit rather than an address that specifies where the data unit is physically or logically stored in the storage system.

In OAS, a content unit may be identified using its object identifier and the object identifier may be independent of both the physical and logical locations where the content unit is stored. In other words, the object identifier does not control where the content unit is logically or physically stored. Thus, if a physical or logical location of a content unit changes, the identifier for access to the unit of content may remain the same. Thus, an application program may simply track the name and/or location of a file rather than tracking the block addresses of each of the blocks on disk that store the content.

Many storage systems have separate systems to de-duplicate and compress data and replication software is often added post system build. Server vendors have used available building blocks to slash server prices dramatically, yet storage incumbents continue to overcharge customers for their storage servers. Architectural complexity, non-integrated products, expensive proprietary networking protocols, cumbersome administration and licensing for every module of software are the norm and burden storage consumers with high prices and high maintenance.

Modern computing ecosystems rely on resilient data availability for most of their functions. This translates directly into failure-resilient storage systems, which have fostered the development of strategies in storage server solutions like clustering (multiple computers per file system), shared storage, and splitting of compute and file-system responsibilities. Simultaneously, the network file-system protocols like CIFS (Common Internet File System) and NFS (Network File System) have undergone modifications that allow applications running on remote clients to receive a seamless flow of data, irrespective of storage node failures at the server. This is primarily achieved by making the storage server cluster guarantee that once a client acquires a handle on a file by opening it, the cluster and not a specific node will honor client interactions for this file-handle. This guarantee has major implications to the manner in which client's file-handle data must be stored on a storage server.

In a traditional storage server, the storage host node, which services the client's request for opening a file, creates an in-memory context for the client's request to open the file and refers to it for all further client operations using the file-handle that it returns to the client as a part of an open response till the client relinquishes the file-handle, typically through a file-close.

This in-memory context, or client's file-handle info, can be grouped into the following categories. Mode of usage: The manner in which the client wishes to use the file, e.g. read, write, execute, delete etc. Mode of shared usage: The manner in which the client allows other clients to use this file concurrently. Locking information: The extent of the file over which the client wishes exclusive access. This state may also contain information about any soft-lock or opportunistic lock that the client holds for caching read and writes to the file locally. Any application specific context that the client wishes to save as opaque metadata for the lifetime of the file-handle.

For a failure-resilient storage system, this in-memory state, referred to as 'persistent-handle-info' or PHDL-info hereafter, must be made available to other nodes of the system, so that in the event of primary node failure, any other node in the storage cluster can serve the data to clients once the latter present their persistent-handles for reconnection. However, storing the persistent-handle-info for long time-intervals can cause considerable memory consumption on the storage server.

SUMMARY OF THE INVENTION

A method for managing file system memory includes implementing a separate replacement policy and a separate index for a persistent second level file replacement cache (ARC) logically part of a first level ARC. The method also includes clustering compressed chunks of data on multiple physical devices via aligning the clusters of data chunks on a byte boundary basis on each of the devices. The method additionally includes creating a storage pool allocator (SPA) to track the compressed and packed chunks on the multiple devices via an attached active page and attached multiple closed pages. The method further includes de-clustering data collection independently in chunks away from a device used for writing the data in favor of a most appropriate device for writing a full chunk of data. The method yet includes re-adding evicted data from the L2ARC to an active page to be written again thereto based on a configurable number of hits to data in the L2ARC via an L2ARC hit counter.

A system for managing file system memory includes a module configured to implement a separate replacement policy and a separate index for a persistent second level file replacement cache (ARC) logically part of a first level ARC. The system also includes a module configured to cluster compressed chunks of data on multiple physical devices via aligning the clusters of data chunks on a byte boundary basis on each of the devices. The system additionally includes a module configured to create a storage pool allocator (SPA) to track the compressed and packed chunks on the multiple devices via an attached active page and attached multiple closed pages. The system further includes a module configured to de-cluster data collection independently in chunks away from a device used for writing the data in favor of a most appropriate device for writing a full chunk of data. The system yet includes a module configured to re-add evicted data from the L2ARC to an active page to be written again thereto based on a configurable number of hits to data in the L2ARC via an L2ARC hit counter.

A non-transitory processor-readable storage medium is disclosed having one or more instructions which when executed by at least one processing circuit causes the at least one processing circuit to implement a separate replacement policy and a separate index for a persistent second level file replacement cache (ARC) logically part of a first level ARC. The instructions also include clustering compressed chunks of data on multiple physical devices via aligning the clusters of data chunks on a byte boundary basis on each of the devices. The instructions additionally include creating a storage pool allocator (SPA) to track the compressed and packed chunks on the multiple devices via an attached active page and attached multiple closed pages. The instructions further include de-clustering data collection independently in chunks away from a device used for writing the data in favor of a most appropriate device for writing a full chunk of data. The instructions yet include re-adding evicted data from the L2ARC to an active page to be written again thereto based on a configurable number of hits to data in the L2ARC via an L2ARC hit counter.

Other aspects and advantages of embodiments of the disclosure will become apparent from the following detailed description, taken in conjunction with the accompanying drawings, illustrated by way of example of the principles of the disclosure.

Figure 1:
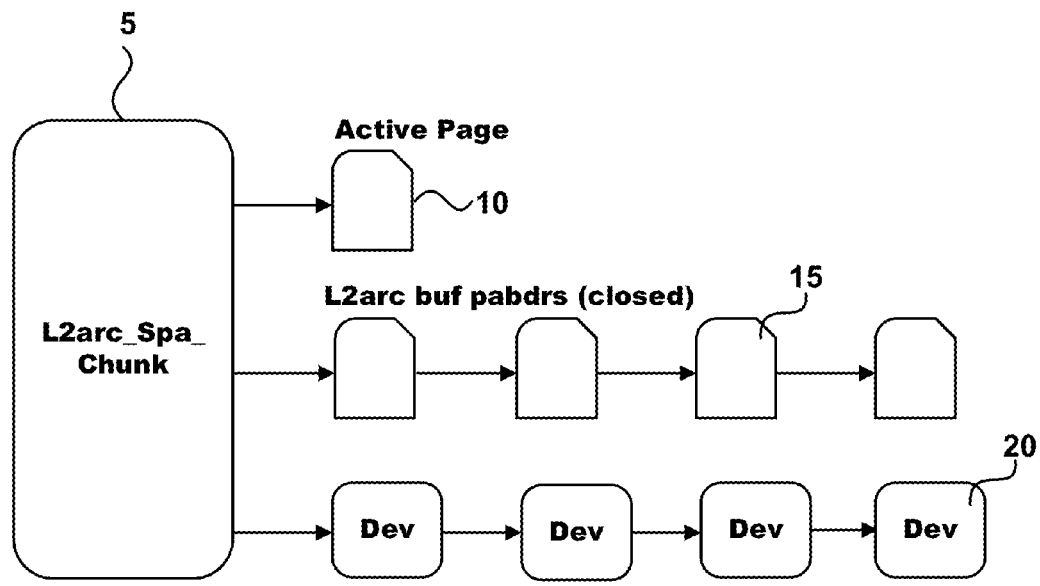
FIG. 1 illustrates the functions of the SPA_Chunk in block diagram including attaching closed pages written out in large sequential I/Os in accordance with an embodiment of the present disclosure.

Throughout the description, similar reference numbers may be used to identify similar elements in the several embodiments and drawings. Although specific embodiments of the invention have been illustrated, the invention is not to be limited to the specific forms or arrangements of parts so described and illustrated. The scope of the invention is to be defined by the claims herein and their equivalents.

DETAILED DESCRIPTION

Reference will now be made to exemplary embodiments illustrated in the drawings and specific language will be used herein to describe the same. It will nevertheless be understood that no limitation of the scope of the disclosure is thereby intended. Alterations and further modifications of the inventive features illustrated herein and additional applications of the principles of the inventions as illustrated herein, which would occur to one skilled in the relevant art and having possession of this disclosure, are to be considered within the scope of the invention.

Throughout the present disclosure, the term 'L2ARC' refers to a second level adaptive replacement cache which stores both most frequently used (MFU) blocks of data and most recently used (MRU) blocks of data stored in RAM (random access memory). The term 'uberblock' refers to a root ZFS memory partition of a giant dynamic tree whose leaves contain data, similar to a superblock in other file systems. ARC improves the basic LRU strategy by splitting the cache directory into two lists each of recently and frequently referenced entries. Each of these is extended with a ghost list which is attached to the bottom of the two lists. These ghost lists act as scorecards by keeping track of the history of recently evicted cache entries, and the algorithm uses ghost hits to adapt to recent change in resource usage. Note that the ghost lists only contain metadata (keys for the entries) and not the resource data itself, i.e. as an entry is evicted into a ghost list its data is discarded. A hash table implements an associative array to look up an index value. A 'doubly linked list' refers to two fields, called links that are references to the previous and to the next node in the list sequence. The beginning and ending nodes' previous and next links, respectively, point to either a header portion or a tail portion, to facilitate traversal of the list in either a forward or a backward direction. If there is only one sentinel node, then the list is circularly linked via the sentinel node. It can be conceptualized as two singly linked lists formed from the same data items, but in opposite sequential orders. Therefore, there is no need to keep track of the previous list entry during a walk or traversal and no need to traverse the list to find the previous list entry so that its link can be modified.

The ZFS SSD caching is called L2ARC indicating a second level caching of ARC, the primary page caching mechanism. Conventional L2ARC architecture has several inefficiencies which primary limits the scaling of performance and the file system capacity. The core issues are listed below.

Tightly Coupled ARC and L2ARC

The L2ARC and ARC are a tightly coupled implementation for logical reasons. The L2ARC is an extension of the current LRU (least recently used page replacement algorithm) ghost and MFU (most frequently used) ghost lists. The indexing for L2ARC cached pages are indexed in the ARC itself. This has 2 side-effects: a) the memory required to represent L2ARC is very high, b) The write performance from ARC to L2ARC does not scale. It limits exploiting the performance of SSD devices.

Variable Compression Storage

For best utilization of the most valued resources, the L2ARC chunks should be stored with little fragmentation. Each block is written independently, but, it is aligned to the sector size of the device. The current implementation limits variable size chunking, and hence, underutilizes space up to 25% with small block sizes on SSD devices with a 4K sector size.

I/O Clustering

The current design writes each ARC buffer separately. The L2ARC writes are completely sequentially, and utilized to cluster the writes to make larger I/Os (input/outputs).

Efficient L2ARC Persistence and Restore

In an embodiment of the disclosure, a very low-overhead persistent architecture is disclosed to facilitate an import/export or boot without a significant drop in performance Scan Resistant L2ARC The L2ARC conventional implementation can wipe out all the SSD cache when performing burst of scans oriented operations like virus scan, backup, etc., and can therefore wipe out all the useful cache memory accumulated over a period of time.

To address these issues, L2ARC was implemented as disclosed. The major design theme centered around scaling the L2ARC performance with increasing a number of devices and accumulating the most useful caches over a period of time. This disclosure covers the new architecture and touches on the cache replacement policy and reserves the right to further disclosure.

New Architecture

The ARC and L2ARC are now fully independent layers. The L2ARC is moved closer to the device and acts as a pure cache of data devices. The L2ARC uses its own indexing mechanism. This separation allows implementing a separate policy and mechanism for ARC and L2ARC.

This separation also allows cutting down per-L2ARC buffer memory usage from current 160+ bytes to just 64 bytes. In addition, it cuts down the ARC Buffer header (buf hdr) size as well. This allows reducing memory consumption by roughly more than two thirds (⅔) from non-implemented versions.

The new design clusters all the small chunks into big chunks (1 MB), and tightly packs the compressed chunks by aligning them on a byte boundary. Also, a per Zpool level L2ARC SPA_Chunk (storage pool allocator) is created which tracks large chunks and devices. Another major separation has been done in de-clustering the data collection in big chunks away from the device used for writing. The chunks are collected independently. Once the chunk is full and ready to be written, the most appropriate device is picked up and the chunk is written on that device.

FIG. 1 illustrates the functions of the SPA_Chunk in block diagram including attaching closed pages written out in large sequential I/Os in accordance with an embodiment of the present disclosure. The depiction includes an L2ARC Spa_Chunk 5, an active page 10, page header buffers 15, and multiple physical devices 20. Reference label pabdrs represents the Page Header. Every 1 MB chunk has a small header (128 bytes) at the top to store the data vector information. There is no logical limit to the number of pages or devices attached to the SPA_Chunk, it is limited only by physical RAM size. However, in practice, the number of pages is tuned to match the bandwidth of the drive. Currently, the number of devices supported is limited to 127 devices in one SPA_Chunk.

SPA_Chunk 5 maintains one active page 10 in memory. The L2ARC feeds threads or reclaims threads appended to the buffer in this active page 10. When the active page 10 is filled up, it is closed and moved to the closed page list. When L2ARC feed thread is called by one of the multiple devices 20, it attaches these closed pages onto the device and writes them out in large sequential I/Os. In an embodiment, the L2ARC feed thread scans through the MRU (most recently used) and MFU (most frequently used) lists in the L1ARC and picks up the eligible buffers. Once picked up, the eligible buffers are added to the active chunk until it is full. Once the active chunk is full it is closed and scheduled to be written to a device, and a new active chunk is started.

L2ARC is intended to store optimized data by design, making it an inherently variable sized allocator. This is driven by the fact that the primary goal of the L2ARC is its optimal use for the best read performance. That's why the allocation policy is kept extremely simple in the form of a sequential and structured log making it a very fast allocator, almost free of internal and external fragmentation. The allocation is done in fixed sized chunks of up to 1 MB each.

Figure 2:
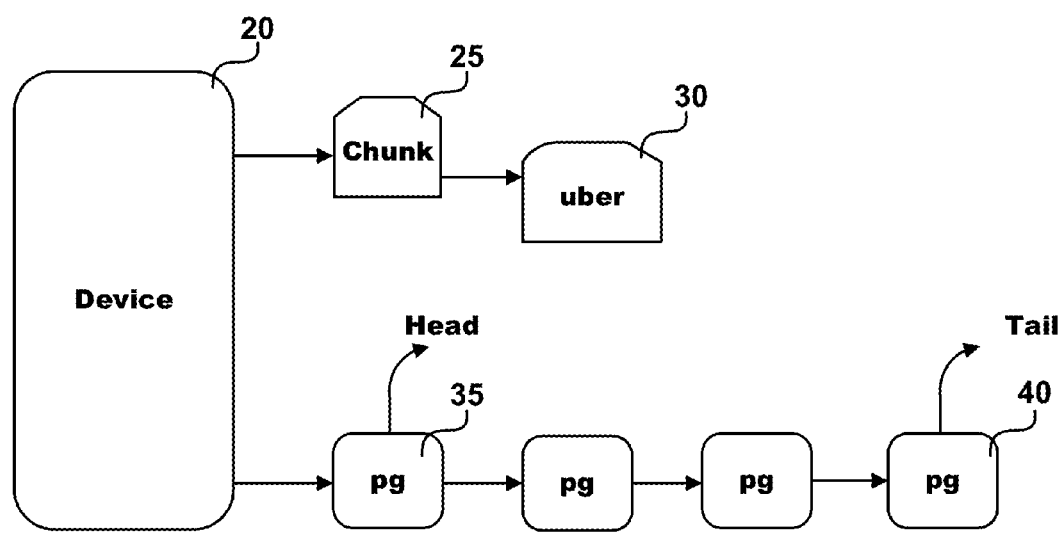
FIG. 2 is a block diagram of a disclosed L2ARC device in relation to an Uber block and a chunk page with a head and tail in accordance with an embodiment of the present disclosure.

FIG. 2 is a block diagram of a device in relation to an Uber block and chunk page with a head and tail in accordance with an embodiment of the present disclosure. The depiction includes a device 20, a chunk page 25 and an uber page 30. The multiple pages depicted include a header 35 and a tail 40. Each device is a collection of chunk pages+uber pages. The Uber page tracks the head and tail chunk pages. Every page is chained in a doubly linked list starting from an Uber page and terminating at the Uber page, represented by the head and tail. The head represents where allocation will happen and the tail represents the range which is a valid range. In an embodiment, uberblocks are at a fixed location on a device, inter alia to allow for restore to work and are separate from a singly linked list. The uberblocks contain a pointer to the head of the list, and restore walks the list from there until it hits the tail indicated in the uberblock.

Figure 3:
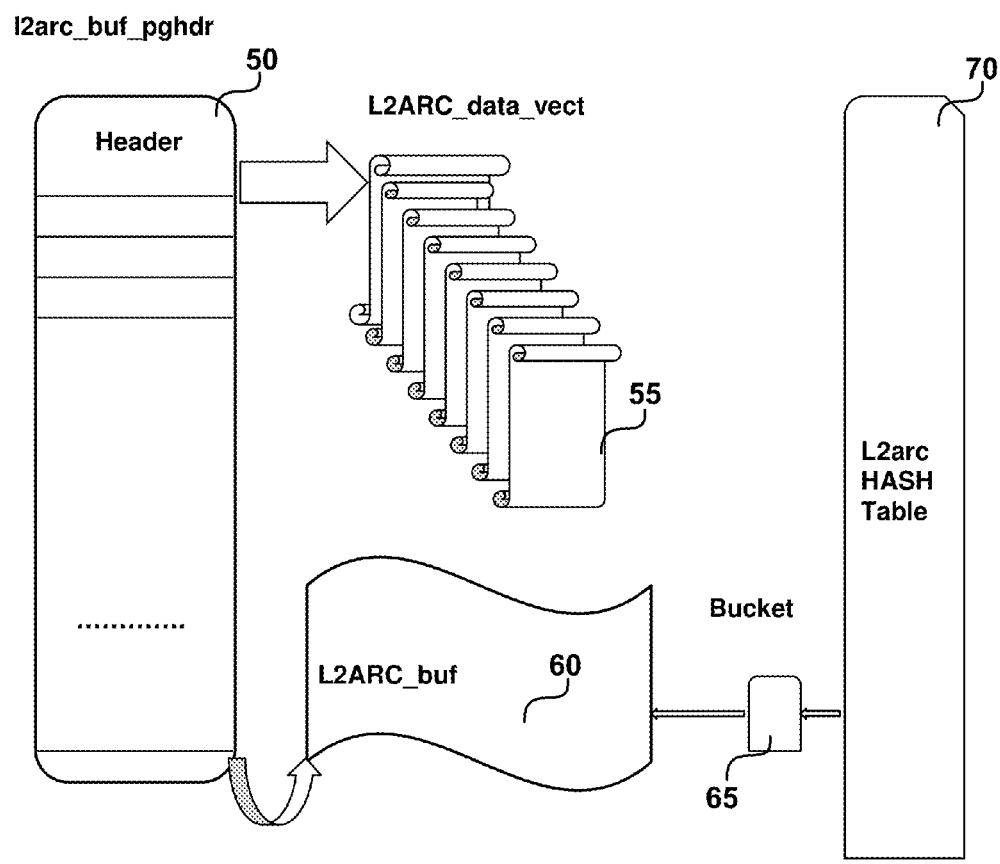
FIG. 3 is a block diagram of an in-memory page header list indexed in the L2ARC hash table with buffer, bucket and data vectors in accordance with an embodiment of the present disclosure.

FIG. 3 is a block diagram of an in-memory page header list indexed in the L2ARC hash table with buffer, bucket and data vectors in accordance with an embodiment of the present disclosure. The depiction includes an L2ARC buffer header 50, multiple L2ARC data vectors 55, an L2ARC buffer 60, a bucket register file 65 and an L2ARC hash table 70. The hash table is global structure (for all devices) with the key as device, and disk virtual address. The value is the location on the disk determined by the chunk page+start offset in the page+size of the chunk. In an embodiment, the device is part of the value, not part of the key. Given a description of the data in the disk virtual address, the device is found and the offset on that device where the data resides is also found.

Each zpool maintains one l2arc_spa_chunk which maintains the list of all the L2ARC devices of the zpool. Each device maintains the in-memory l2arc_buf_pghhdr list which is indexed in the L2ARC hash table. Each device maintains its own head, tail, and, cycle number for recovery purposes. This information is maintained in the per device Uber block.

The L2ARC hash table, however, points to the data location directly. So, for read purposes, the data is fetched from the drives directly without any requirement to read the header first.

Figure 4:
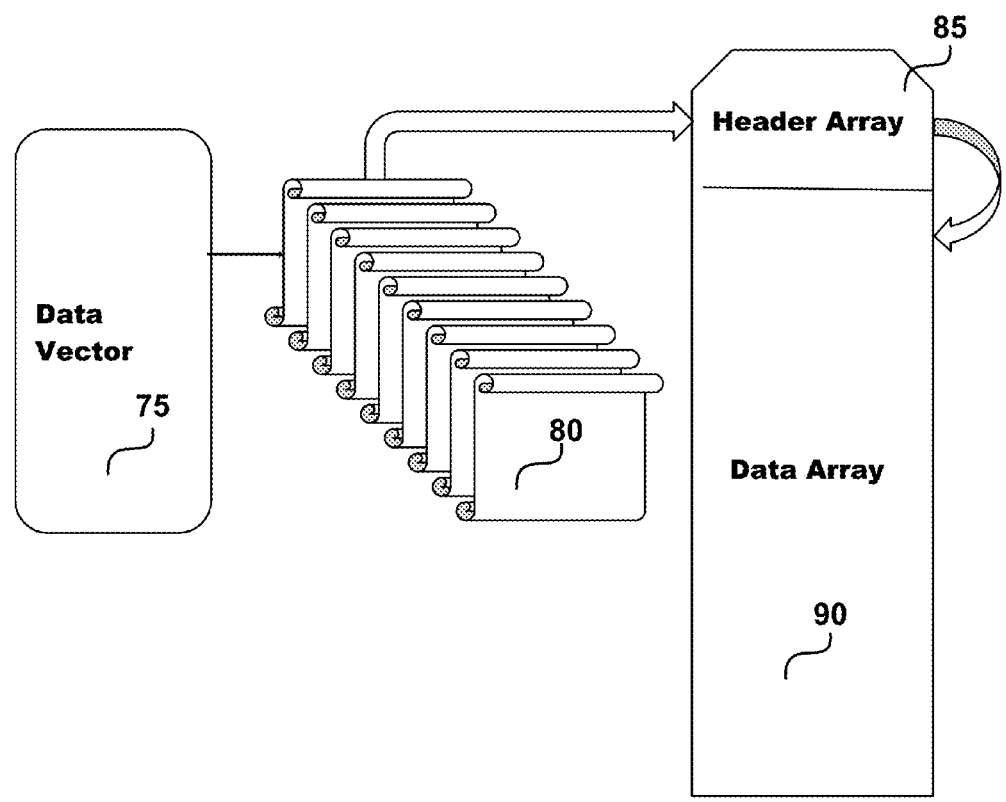
FIG. 4 is a block diagram of fixed size chunks assembled in contiguous data vectors in relation to the header and metadata for the data array in accordance with an embodiment of the present disclosure.

FIG. 4 is a block diagram of fixed size chunks assembled in contiguous data vectors in relation to the header and metadata for the data array in accordance with an embodiment of the present disclosure. The depiction includes a data vector 75, multiple data segments 80, a header array 85 and a data array 90. The contiguous data vectors (scrolled pages) create a header that helps reading metadata from the devices and data from the array. When there is crash, only the header portion is read from the page headers and the chain is sequentially scanned to discover all the chunks present on the L2ARC. In an embodiment, it is not just crashes that cause a restore. Anything that clears the contents of RAM, such as a reboot will also trigger a restore since the headers describing the data must be read from SSD and restored to RAM.

The allocation and de-allocation unit at the physical level is done in fixed 1 MB size chunks. Each data unit is stored in variable size within this chunk. Several such chunks are assembled in a data vector. The data vector is the logical chunk from the L2ARC perspective. First data vector contains the header portion containing the metadata of the data contained in data region of the chunk. This logical unit is stored contiguously on the drive.

Recovery

Each device maintains 2 Uberblocks which are updated every second alternately. An Uberblock points to the last known header block which was persisted. The header block of each such block, also maintains the previous header location, thus making a linked list on the disk. The restore operation fetches each header block and populates the in-memory index.

Data Retention

Every time data is read from the L2ARC, a hit counter on the in-memory header is incremented. The device will eventually fill up and must start evicting data in order to make room for new data. When the data is getting evicted, if it has "enough" hits per a configurable threshold, the data will be read off the disk before it is thrown away, and it is re-added to the current active chunk to be written again, and its hit counted will be reset. This ensures that data used many times is saved in the cache rather than being discarded.

Figure 5:
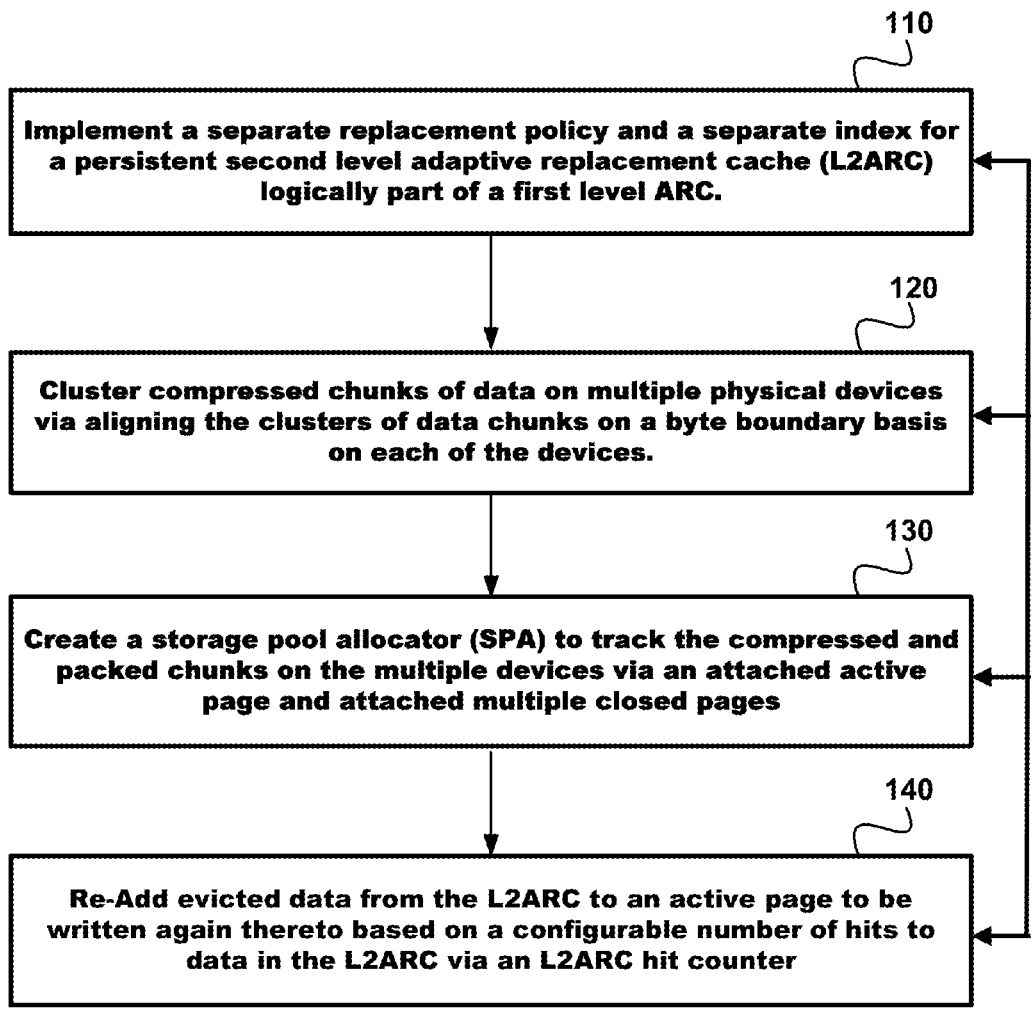
FIG. 5 is a flow chart of an independent method for implementing a scalable and persistent L2ARC in accordance with an embodiment of the present disclosure.

FIG. 5 is a flow chart of an independent method for implementing a scalable and persistent L2ARC in accordance with an embodiment of the present disclosure. The method for managing file system memory includes 110 implementing a separate replacement policy and a separate index for a persistent second level file replacement cache (ARC) logically part of a first level ARC. The method also includes clustering 120 compressed chunks of data on multiple physical devices via aligning the clusters of data chunks on a byte boundary basis on each of the devices. The method additionally includes 130 creating a storage pool allocator (SPA) to track the compressed and packed chunks on the multiple devices via an attached active page and attached multiple closed pages. The method further includes 140 re-adding evicted data from the L2ARC to an active page to be written again thereto based on a configurable number of hits to data in the L2ARC via an L2ARC hit counter.

Figure 6:
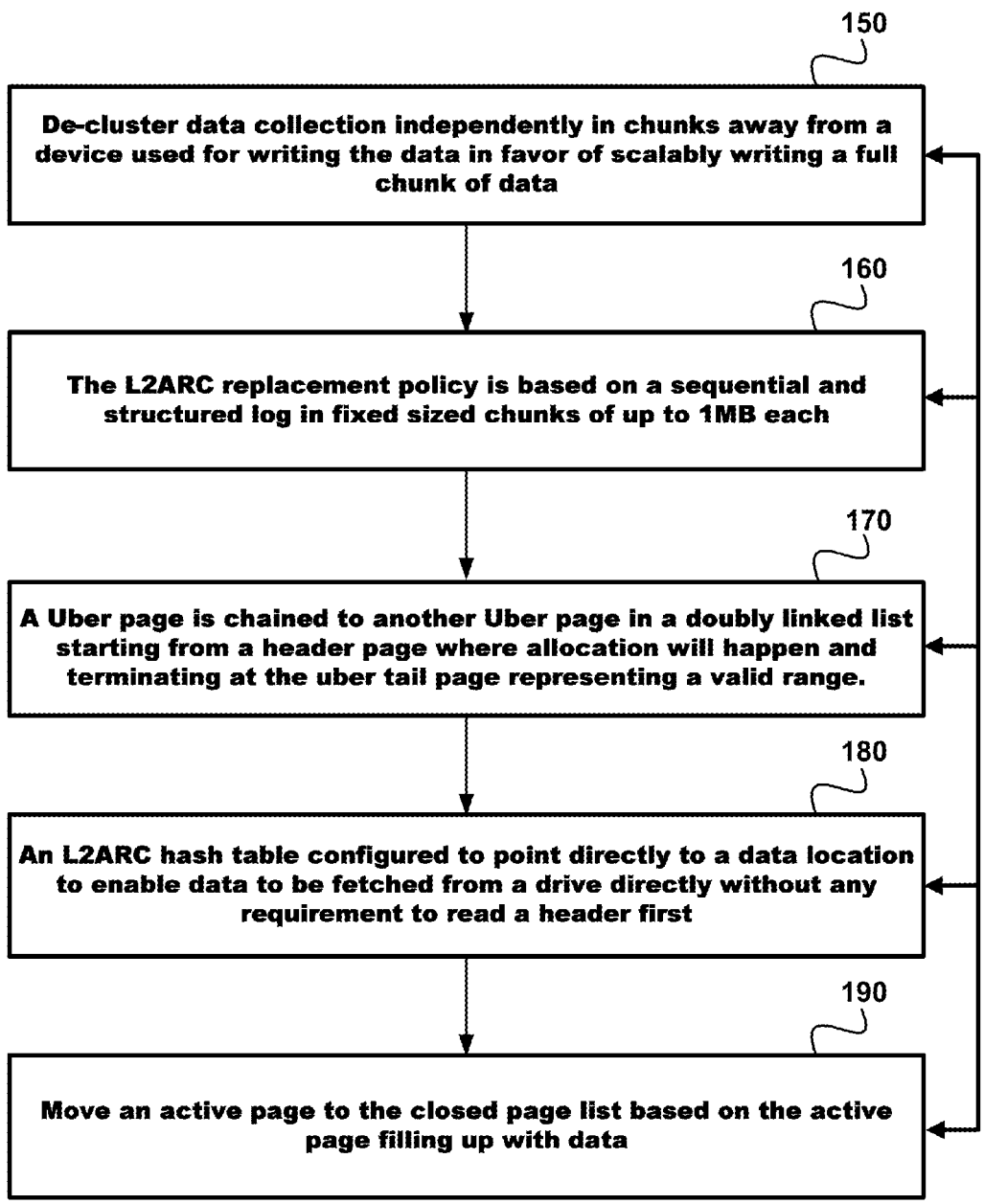
FIG. 6 is a flow chart of a dependent method for implementing a scalable and persistent L2ARC in accordance with an embodiment of the present disclosure.

FIG. 6 is a flow chart of a dependent method for implementing a scalable and persistent L2ARC in accordance with an embodiment of the present disclosure. The method includes declustering 150 a data collection independently in chunks away from a device used for writing the data in favor of scalably writing a full chunk of data. The method includes 160 an L2ARC replacement policy is based on a sequential and structured log in fixed sized chunks of up to 1 MB each. A Uber page is chained 170 to another Uber page in a doubly linked list starting from a header page where allocation will happen and terminating at the Uber tail page representing a valid range. An L2ARC has table is configured 180 to point directly to a data location to enable data to be fetched from a drive directly without any requirement to read a header first. An active page is moved 190 to the closed page list based on the active page filling up with data.

Figure 7:
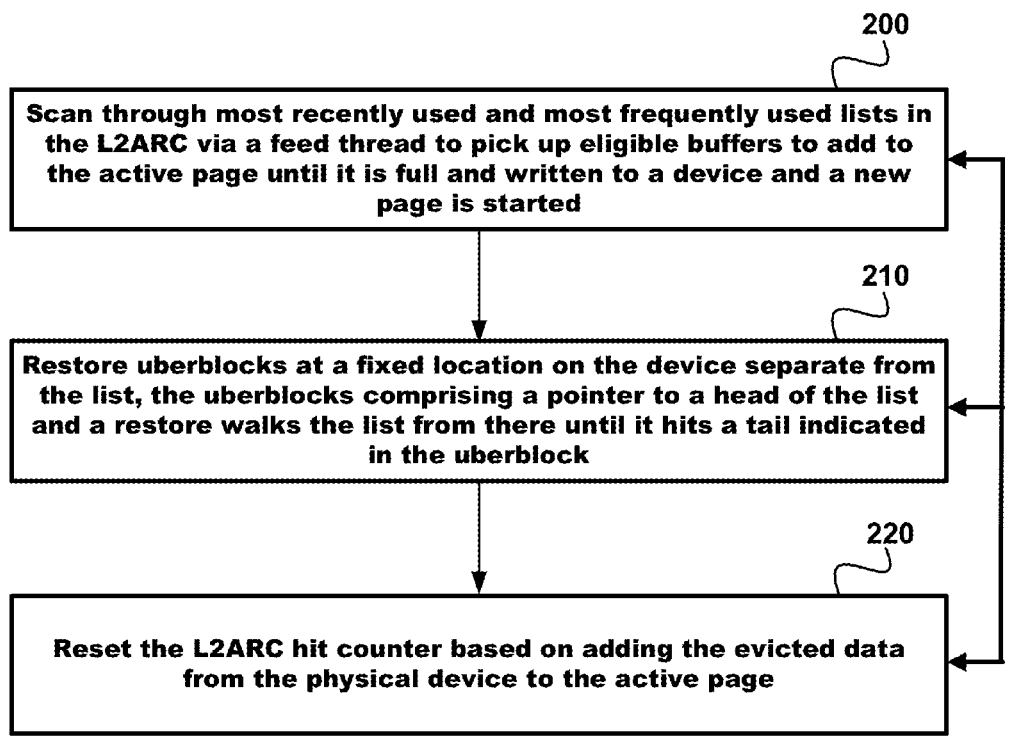
FIG. 7 is a flow chart of a scan, restore and reset method for implementing a scalable and persistent L2ARC in accordance with an embodiment of the present disclosure.

FIG. 7 is a flow chart of a scan, restore and reset method for implementing a scalable and persistent L2ARC in accordance with an embodiment of the present disclosure. A scan 200 through most recently used and most frequently used lists in the L2ARC via a feed thread picks up eligible buffers to add to the active page until it is full and ready to be written to a device. Thereafter a new page is started. Uberblocks are restored 210 at a fixed location on the device separate from the list, the uberblocks include a pointer to a header of the list and the restore walks the list therefrom until it hits a tail indicated in the uberblock. The L2ARC hit counter is reset 220 based on adding the evicted data from the physical device to the active page.

Figure 8:
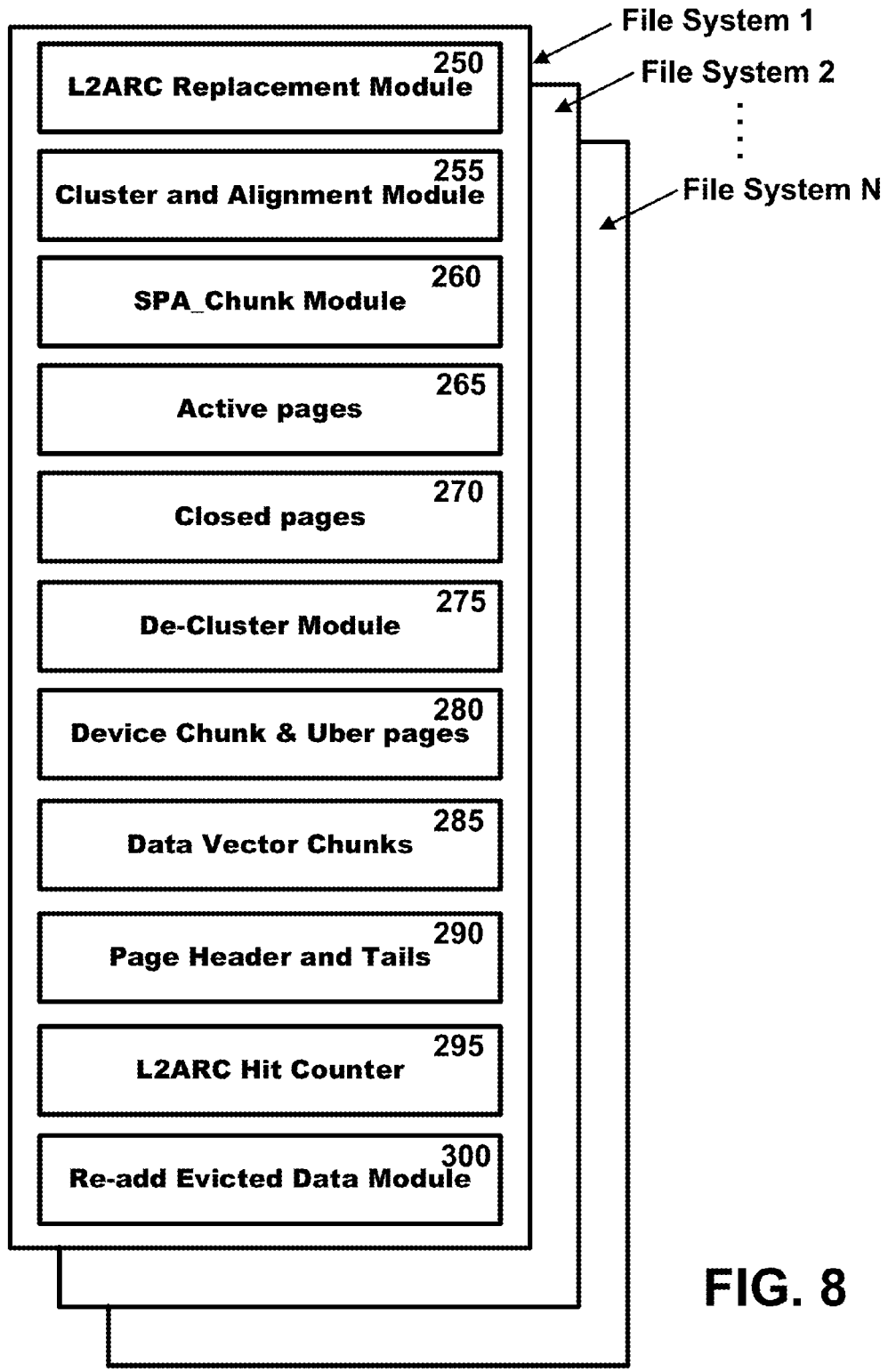
FIG. 8 is a block diagram of components of a system configured to implement a scalable and persistent L2ARC in accordance with an embodiment of the present disclosure.

FIG. 8 is a block diagram of components of a system configured to implement a scalable and persistent L2ARC in accordance with an embodiment of the present disclosure. The system includes an L2ARC replacement module 250, a cluster and alignment module 255, a SPA_Chunk module 260, active pages 265, closed pages 270, a de-cluster module 275, a device chunk and uber pages 280, contiguous data vector chunks 285, page header and tails 290 and a file system storage pool 295 as disclosed herein. The disclosed system also includes a re-add evicted data module 300. Multiple file systems 1, 2 through N file systems are also included in embodiments of the disclosure.

SSDs can be used as a second level ARC cache. Blocks that can't be stored in the RAM-based ARC can then be stored on SSDs and in case they're needed, they can still be delivered quicker to the application than by fetching them again from disk. An SSD that is used as a second level ARC is therefore called an L2ARC, or a "cache device".

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner. While the forgoing examples are illustrative of the principles of the present disclosure in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the disclosure be limited, except as by the specification and claims set forth herein.

What is claimed is:

1. A method for managing file system memory, the method comprising:
   a) implementing a separate replacement policy and a separate index for a persistent second level adaptive replacement cache (L2ARC) logically part of a first level ARC;
   b) cluster writing compressed chunks of data on multiple physical devices via aligning the clusters of data chunks on a byte boundary basis on each of the devices, thereby creating compressed and packed chunks;
   c) creating a storage pool allocator (SPA) to track the compressed and packed chunks on the multiple devices via an active page and multiple closed pages;
   d) re-adding an evicted data from the L2ARC to an active page to be written again to the L2ARC based on a configurable threshold number of hits to data in the L2ARC via an L2ARC hit counter; and
   e) providing an L2ARC hash table configured to point directly to a data location to enable data to be fetched from one of the multiple devices directly without any requirement to read a header first.

2. The method for managing file system memory of claim 1, further comprising de-clustering a data collection independently in chunks away from a device used for writing the data in favor of a device for writing a full chunk of data in a scalable write policy.

3. The method for managing file system memory of claim 1, wherein the replacement policy is based on a sequential and structured log in fixed sized chunks of up to 1 MB each.

4. The method for managing file system memory of claim 1, wherein the data chunks include logically contiguous data vectors configured with a header to facilitate reading metadata from the multiple devices and to facilitate reading data from an array.

5. The method for managing file system memory of claim 1, further comprising providing a feed thread configured to scan through a most recently used (MRU) and a most frequently used (MFU) list in the L2ARC and pick up eligible buffers to add to the active page until it is full and written to a device and a new page is started.

6. The method for managing file system memory of claim 1, further comprising providing a plurality of uberblocks at a fixed location on the multiple devices separate from a list, the uberblocks comprising a pointer to a head of the list and a restore operation to walk the list from the head until it hits a tail indicated in an Uber block.

7. The method for managing file system memory of claim 1, further comprising resetting the L2ARC hit counter based on adding the evicted data from a physical device to the active page.

8. The method for managing file system memory of claim 1, further comprising providing a page header buffer and a bucket register file logically disposed between a SPA_Chunk and the hash table.

9. The method for managing file system memory of claim 1, wherein each multiple device is logically a collection of chunk pages plus Uber pages configured to track a head and a tail of the chunk pages.

10. The method for managing file system memory of claim 9, wherein the multiple pages include an Uber page chained to another Uber page in a doubly linked list starting from an uber header portion of an Uber page representing where allocation will happen and terminating at an uber tail portion of an Uber page representing a valid range.

11. A system for managing file system memory, the system comprising:
    a) a module configured to implement a separate replacement policy and a separate index for a persistent second level adaptive replacement cache (L2ARC) logically part of a first level ARC;
    b) a module configured to cluster compressed chunks of data on multiple physical devices via aligning the clusters of data chunks on a byte boundary basis on each device, thereby creating compressed and packed chunks;
    c) a storage pool allocator (SPA) configured to track the compressed and packed chunks on the multiple devices via an attached active page and attached multiple closed pages;
    d) a module configured to re-add an evicted data from the L2ARC to an active page to be written again to the L2ARC based on a configurable threshold number of hits to data in the L2ARC via an L2ARC hit counter; and
    e) an L2ARC hash table configured to point directly to a data location to enable data to be fetched from one of the multiple devices directly without any requirement to read a header first.

12. The system for managing file system memory of claim 11, further comprising a scalable write module configured to de-cluster data collection independently in chunks away from a device used for writing the data in favor of a most appropriate device for writing a full chunk of data.

13. The system for managing file system memory of claim 11, wherein the replacement policy is based on a sequential and structured log in fixed sized chunks of up to 1 MB each.

14. The system for managing file system memory of claim 11, wherein the chunks are logically contiguous data vectors configured to create a header to facilitate reading metadata from the devices and to facilitate reading data from an array.

15. The system for managing file system memory of claim 11, further comprising a module configured to move an active page to a closed page list based on the active page filling up with data.

16. The system for managing file system memory of claim 11, wherein each device is logically a collection of chunk pages plus Uber pages configured to track a head and a tail of the chunk pages.

17. The system for managing file system memory of claim 16, wherein each Uber page is chained to another Uber page in a doubly linked list starting from an uber header portion of an Uber page representing where allocation will happen and terminating at an uber tail portion of an Uber page representing a valid range.

18. A non-transitory processor-readable storage medium having one or more instructions which when executed by at least one processing circuit causes the at least one processing circuit to:

a) implement a separate replacement policy and a separate index for a persistent second level adaptive replacement cache (L2ARC) logically part of a first level ARC;
b) cluster write compressed chunks of data on multiple physical devices in the L2ARC via aligning the clusters of data chunks on a byte boundary basis on each of the devices, thereby creating compressed and packed chunks;
c) create a storage pool allocator (SPA) to track the compressed and packed chunks on the multiple devices via an attached active page and attached multiple closed pages;
d) re-add an evicted data from the L2ARC to an active page to be written again to the L2ARC based on a configurable threshold number of hits to data in the L2ARC via an L2ARC hit counter; and
e) provide an L2ARC hash table configured to point directly to a data location to enable data to be fetched from one of the multiple devices directly without any requirement to read a header first.

* * * * *